PULSE GENERATOR PRODUCES PULSES FOR DURATION OF INPUT SIGNAL

Filed March 29, 1966

INVENTOR.
ELMO V. NEAL

BY John F Lawler
ATTORNEY 3,323,074
Patented May 30, 1967

3,323,074

PULSE GENERATOR PRODUCES PULSES FOR DURATION OF INPUT SIGNAL

Elmo V. Neal, San Jose, Calif., assignor to Sylvania Electric Products Inc., a corporation of Delaware Filed Mar. 29, 1966, Ser. No. 538,276
7 Claims. (Cl. 331—111)

This invention is related to pulse generators and more particularly to a generator for producing a train of pulses.

In certain applications such as equipment test and instrumentation, it is necessary to generate a train of pulses or a predetermined number of pulses during the time duration of the application of an input signal. Prior art pulse generators for accomplishing this operation employ logic circuitry which requires a number of components to control the operation of a number of multivibrators. The less complex of these pulse generators do not provide independent control of pulse width and interpulse spacing of pulses that are generated.

An object of this invention is the provision of a pulse generator comprising only a small number of active elements.

Another object is the provision of a pulse generator that is realtively simple and economical to build.

Another object is the provision of a pulse generator that is relatively simple in construction and yet has separate mechanism for providing independent control of either the time between the application of an input signal and the generation of the first output pulse or the pulse width or the interpulse spacing of output pulses.

Briefly, this invention employs a monostable multivibrator which includes a pair of transistors, and a relaxation oscillator which includes one of the transistors of the multivibrator. The relaxation oscillator also includes a third transistor which has a collector electrode connected to the collector electrode of the one transistor and a capacitor which is connected to the base electrode of the third transistor. The emitter electrode of the third transistor is connected through a semiconductor diode to ground to increase the base bias voltage required to cause the third transistor to conduct. When a D.C. input signal is applied to the oscillator, the capacitor charges to a prescribed value which biases the third transistor to conduct in saturation to cause the one transitsor to conduct in saturation in order to discharge the capacitor through the one transistor to cause the multivibrator to generate an output pulse. This operation continues until the input signal is removed from the oscillator. The width of output pulses coupled from the other transistor of the multivibrator is determined by the RC time constant controlling the conduction time of the other transistor. The interpulse spacing of the output pulses is determined by the RC time constant controlling the charge rate of the capacitor.

This invention will be more fully understood from the following detailed description of a preferred embodiment thereof together with the accompanying drawing in which.

Figure 1:
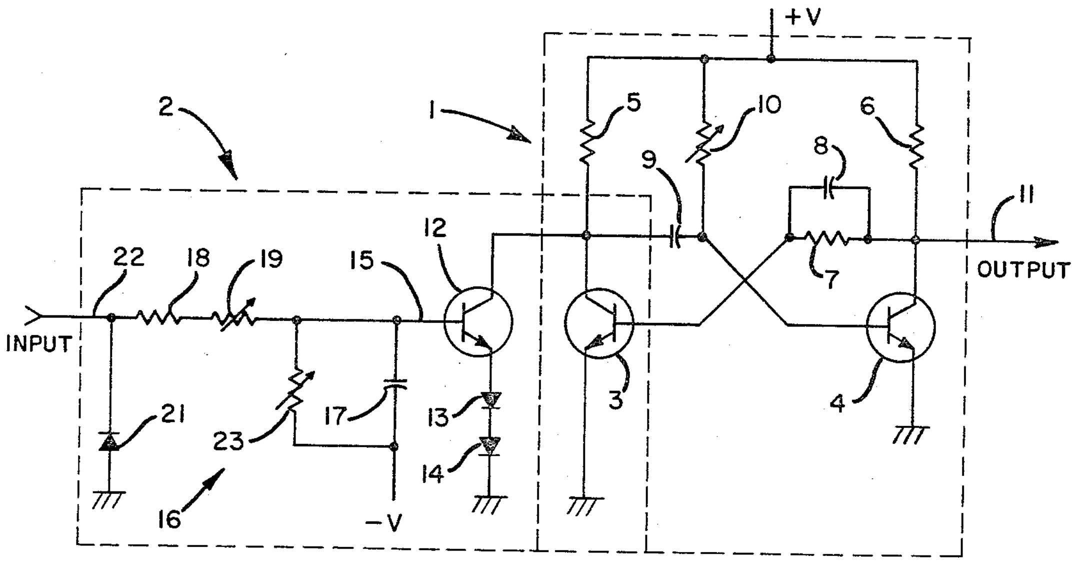
FIGURE 1 is a schematic circuit diagram of the invention.

Referring to the drawing, the pulse generator embodying this invention comprises a monostable multivibrator 1 and a relaxation oscillator 2. The monostable multivibrator 1 comprises transistors 3 and 4 which have collector electrodes connected through load resistors 5 and 6, respectively, to a voltage source +V. The emitter electrodes of transistors 3 and 4 are connected to a ground reference potential. The base electrode of transistor 3 is connected through the shunt combination of the resistor 7 and capacitor 8 to the collector electrode of transistor 4. The base electrode of transistor 4 is connected through capacitor 9 to the collector electrode of transistor 3 and is connected through variable resistor 10 to the voltage source +V. The output of the multivibrator is coupled on line 11 from the collector electrode of transistor 4.

Relaxation oscillator 2 comprises transistor 12 and the transistor 3 which is also an element of the monostable multivibrator. The collector electrode of transistor 3 is directly connected to the collector electrode of transistor 12. The emitter elecrode of transisor 12 is connected through diodes 13 and 14 to ground. Diodes 13 and 14 bias transistor 12 such that when a signal of sufficient magnitude to cause the transistor to conduct is applied on line 15 to the base electrode, transistor 12 saturates.

An integrator 16 is connected to the base electrode of transistor 12. The integrator comprises capacitor 17, which is connected between a voltage source −V and the base electrode of transistor 12, and fixed resistor 18 and variable resistor 19. A diode 21 is connected between input line 22 and ground and a variable resistor 23 is connected in parallel with capacitor 17 in order to provide a mechanism for adjusting the bias voltage applied to the base electrode of transistor 12.

Figure 2:
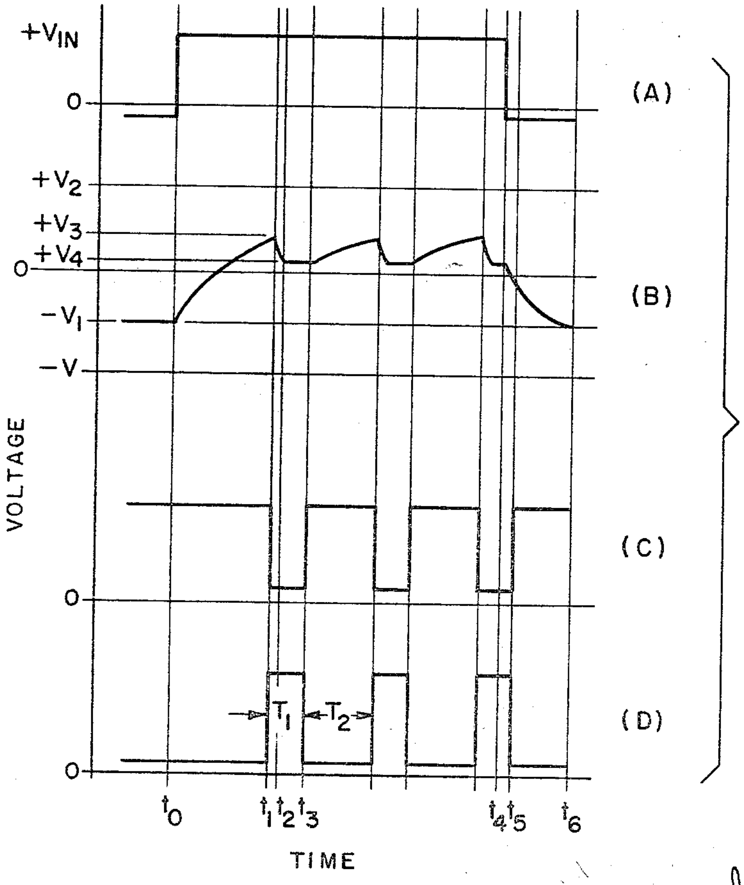
FIGURES 2A to 2D are waveforms illustrating the operation of the circuit of FIGURE 1.

Referring to FIGURE 2, the waveform of FIGURE 2A represents the input signal on line 22; the waveform of FIGURE 2B represents the voltage stored by capacitor 17; the waveform of FIGURE 2C represents the collector voltage of transistor 3; and the waveform of FIGURE 2D represents the collector voltage of transistor 4 and the output on line 11. The RC time constant of variable resistor 10 and capacitor 9 controls the conduction time of transistor 4 and thus the width $T_1$ (FIGURE 2D) of the output pulses on line 11. The interpulse spacing $T_2$ (FIGURE 2D) of output pulses of the multivibrator on line 11 is determined by the RC time constant of resistors 18 and 19, and capacitor 17.

During the quiescent state when an input signal is not applied on line 22 to the relaxation oscillator, transistor 3 is cut off and transistor 4 is in saturation as a result of the biasing and regenerative action of the multivibrator. Current flow through diode 21, resistors 18, 19, and 23 and capacitor 17 causes the capacitor to charge to a predetermined voltage $-V_1$ (FIGURE 2B) which is less than the supply voltage −V. The resistance of resistors 18, 19, and 23 and the voltage source −V determine the voltage $-V_1$ which is initially stored by capacitor 17. Transistor 12 is reverse-biased and cut off by the bias voltage $-V_1$ which is applied on line 15 to its base electrode.

When a positive input voltage (FIGURE 2A) is applied at time $t_0$ on line 22 to the relaxation oscillator, diode 21 is reverse-biased and cut off and capacitor 17 is caused to charge from the voltage $-V_1$ toward the voltage $+V_2$ (FIGURE 2B) through resistors 18 and 19. When the voltage on capacitor 17 exceeds the voltage $+V_3$ at time $t_1$, the base-emitter junction of transistor 12 is forward-biased and the transistor saturates. Saturation of transistor 12 causes the collector voltage of transistors 12 and 3 (FIGURE 2C, time $t_1$) to decrease. This change in the collector voltage of transistor 3 is coupled through capacitor 9 to the base electrode of transistor 4 to decrease the conduction and increase the collector voltage thereof (FIGURE 2D, time $t_1$). This change in the collector voltage of transistor 4 is coupled through capacitor 8 to the base electrode of transistor 3 to increase the conduction thereof. This regenerative action continues until transistor 3 conducts in saturation.

Saturation of transistor 3 permits capacitor 17 to discharge through the base-collector junction of transistor 12 and through transistor 3 to the voltage $+V_4$ (FIGURE 2B, time $t_2$), the value of which is determined by the voltage drops across the base-collector junction of transistor 12 and the collector-emitter junction of transistor 3. Simultaneously, capacitor 9 discharges through resistor 10 and transistor 3 until the voltage applied to the base electrode of transistor 4 causes transistor 4 to conduct (FIGURE 2D, time $t_3$) and cuts off transistors 3 and 12 (FIGURE 2C, time $t_3$). When transistor 12 is cut off, capacitor 17 again charges from the voltage $+V_4$ (FIGURE 2B, time $t_3$) to the voltage $+V_3$ to repeat the operation cycle described above. This operation continues until the time $t_4$ when the input voltage is removed from input line 22 (FIGURE 2A). At time $t_4$ (FIGURE 2B), capacitor 17 discharges through resistor 23 until the voltage on capacitor 17 is equal to the predetermined voltage $-V_1$ at time $t_6$. The circuit remains in a quiescent state beginning at time $t_6$ until a positive input voltage is again applied on line 22 to the relaxation oscillator.

By way of example, a pulse generator having the following components and values (and including a resistor 25, not shown, in series with variable resistor 10) was successfully operated and tested:

| | |
|---|---|
| Transistors: | |
| **3** | 2N2222 |
| **4** | 2N2222 |
| **12** | 2N2222 |
| Diodes: | |
| **13** | 1N914 |
| **14** | 1N914 |
| **21** | 1N914 |
| Resistors: | |
| **5** | 6.8K |
| **6** | 6.8KΩ |
| **7** | 68KΩ |
| **10** | 50KΩ |
| **18** | 4.7KΩ |
| **19** | 20KΩ |
| **23** | 220KΩ |
| **25** | 4.7KΩ |
| Capacitors: | |
| **8** ____pf__ | 100 |
| **9** ____pf__ | 560 |
| **17** ____pf__ | 1800 |
| Voltages: | |
| +V ____volts__ | 10 |
| −V ____do__ | 6 |

Although a preferred embodiment of this invention has been shown and described, variations and modifications will be apparent to those skilled in the art. The scope and breadth of this invention is therefore to be determined from the following claims rather than from the above detailed description.

What is claimed is:

1. A pulse generator responsive to an input signal for generating output pulses, comprising an oscillator comprising a first transistor which is cut off during a quiescent state, an integrator having a first terminal for receiving an input signal and having a second terminal, a second transistor having a base electrode connected to the second terminal of said integrator and having a collector electrode, said second transistor being cut off during the quiescent state, first coupling means coupling the collector electrode of said second transistor to said first transistor, and biasing means biasing said second transistor to increase the base votage that is required to cause said second transistor to conduct such that said second transistor conducts in saturation when the voltage stored by said integrator exceed a predetermined value to cause said first transistor to conduct in saturation to reset said integrator through said second transistor and said first transistor.

2. The pulse generator according to claim 1 wherein said second transistor has an emitter electrode, including second coupling means coupling said biasing means to the emitter electrode of said second transistor and including third coupling means coupling said biasing means to a reference potential.

3. The pulse generator according to claim 2 wherein said first transistor has a collector electrode connected to the collector electrode of said second transistor and has an emitter electrode connected to the reference potential, conduction in saturation of said first and second transistors resetting said integrator through the base collector junction of said second transistor and the collector-emitter junction of said first transistor.

4. The pulse generator according to claim 3 wherein said biasing means comprises a first semiconductor diode.

5. The pulse generator according to claim 4 including a first power source, and wherein said integrator comprises a first resistor having a first terminal connected to the base electrode of said second transistor and having a second terminal receiving the input signal, a first capacitor having a first terminal connected to the base electrode of said second transistor and having a second terminal connected to said power source, and means for varying the RC time constant of said integrator for varying the interpulse spacing of output pulses.

6. The pulse generator according to claim 5 including a second semiconductor diode having a first terminal connected to the reference potential and a second terminal conencted to the second terminal of said first resistor, a second resistor connected in parallel with said capacitor, and means for varying the ratio of the resistances of said first and second resistors for varying the delay time between the application of an input signal to the second terminal of said first resistor and the generation of the first output pulse.

7. The pulse generator according to claim 6 including a second power source, and wherein said oscillator comprises a monostable multivibrator wherein said first transistor has a base electrode, said multivibrator comprising a third transistor having base and collector electrodes, said third transistor conducting during the quiescent state, a second capacitor coupling the base electrode of said first transistor to the collector electrode of said third transistor, a third capacitor coupling the base electrode of said third transistor to the collector electrode of said first transistor, a third resistor resistively coupling the base electrode of said third transistor to said second power source, a fourth resistor resistively coupling the collector electrode of said first transistor to said second power source, means for coupling output pulses from the collector electrode of said third transistor, and means for varying the RC time constant of said third resistor and said third capacitor for varying the width of output pulses.

No references cited.

ROY LAKE, *Primary Examiner.*

J. KOMINSKI, *Assistant Examiner.*